United States Patent [19]
Kim

[11] Patent Number: 5,841,702
[45] Date of Patent: Nov. 24, 1998

[54] OUTPUT CIRCUIT FOR MEMORY DEVICE

[75] Inventor: Yun Saing Kim, Cheongju, Rep. of Korea

[73] Assignee: LG Semicon Co., Ltd., Cheongju, Rep. of Korea

[21] Appl. No.: 907,648

[22] Filed: Aug. 11, 1997

[30] Foreign Application Priority Data

Mar. 22, 1997 [KR] Rep. of Korea ............... 1997 9981

[51] Int. Cl.[6] .................................................. G11C 16/04
[52] U.S. Cl. ........................ 365/189.05; 326/27; 326/87
[58] Field of Search ................ 365/189.05; 327/108, 327/112, 379, 380, 381, 383; 326/26, 27, 28

[56] References Cited

U.S. PATENT DOCUMENTS

| | | | |
|---|---|---|---|
| 4,961,010 | 10/1990 | Davis | 307/443 |
| 5,036,222 | 7/1991 | Davis | 307/443 |
| 5,192,879 | 3/1993 | Aoki et al. | 307/451 |
| 5,315,172 | 5/1994 | Reddy | 307/443 |
| 5,414,672 | 5/1995 | Ozeki et al. | 365/233.5 |
| 5,424,982 | 6/1995 | Kato | 365/189.05 |
| 5,517,129 | 5/1996 | Matsui | 326/27 |
| 5,537,060 | 7/1996 | Baek | 326/87 |

*Primary Examiner*—David C. Nelms
*Assistant Examiner*—Tuan T. Nguyen
*Attorney, Agent, or Firm*—Fleshner & Kim

[57] ABSTRACT

An output circuit for a semiconductor memory device includes an output buffer for buffering an externally applied output enable signal and a signal outputted from a sense amplifier in accordance with the output enable signal, and an output driver having a CMOS inverter structure connected between a supply voltage and a ground voltage. The output driver includes two pairs of MOS transistors, each having a transistor of a different channel size connected in parallel with each other. When the sense amplifier carries out a sensing operation, the larger channel size MOS transistors are driven by a voltage from a feedback output terminal. When the sensing operation is completed, both pairs of MOS transistors are simultaneously driven in accordance with an output signal of the output buffer. The circuit increases a data signal output speed and decreases the output noise, by turning the data output signal into a completely tri-stated signal during a sensing operation of the sense amplifier.

22 Claims, 3 Drawing Sheets

FIG. 1
CONVENTIONAL ART
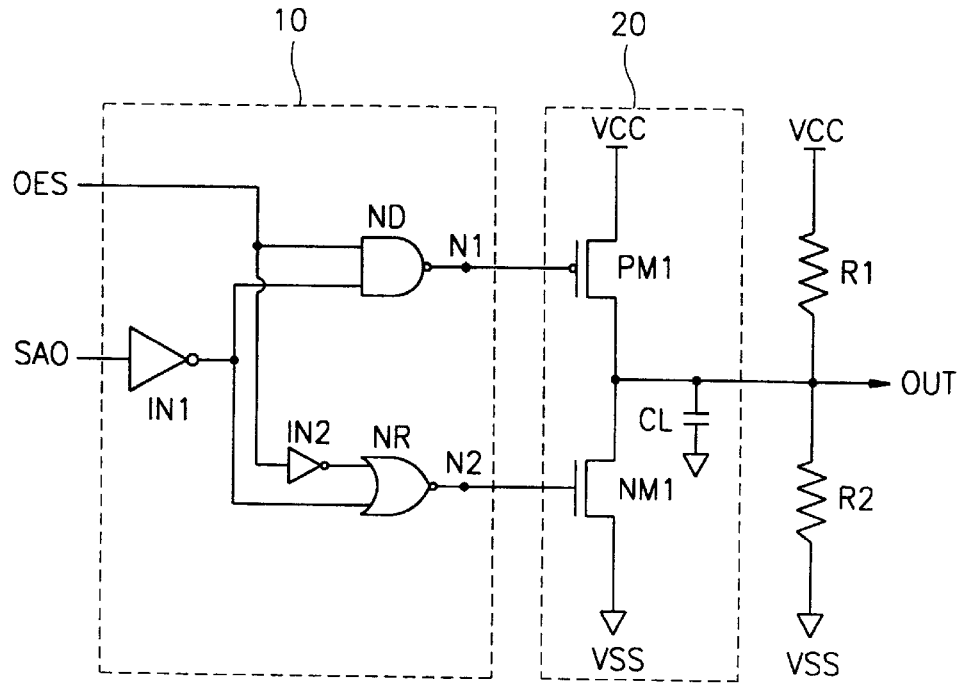
FIG. 2A ADD
CONVENTIONAL ART
FIG. 2B ATD
CONVENTIONAL ART
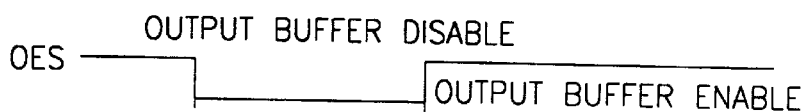
FIG. 2C OES
CONVENTIONAL ART
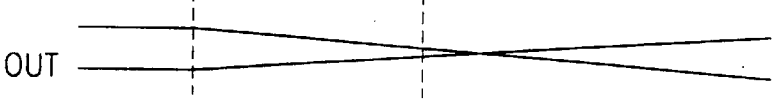
FIG. 2D
CONVENTIONAL ART OUT

FIG. 4A ADD
FIG. 4B ATD
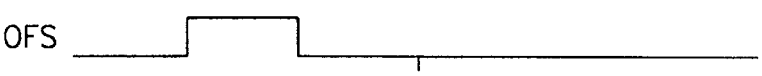
FIG. 4C OFS
FIG. 4D $\overline{OFS}$
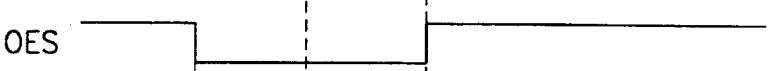
FIG. 4E OES
FIG. 4F OUT
t1  t2  t3

OUTPUT CIRCUIT FOR MEMORY DEVICE

BACKGROUND OF THE INVENTION

1. Field of the Invention

The present invention relates to a semiconductor memory device, and more particularly, to an improved output circuit for a semiconductor memory device.

2. Background of the Related Art

FIG. 1 illustrates a conventional output circuit of a semiconductor memory device. An output buffer 10 receives an output enable signal OES, and a signal SAO outputted from a sense amplifier (not shown) in accordance with the output enable signal OES. An output driver 20 receives signals outputted from the output buffer 10 and outputs a signal for driving an external circuit. The output signal SAO from the sense amplifier (not shown) denotes a sensed memory cell data signal, and the output enable signal OES denotes a signal generated in accordance with an address transition detection signal ATD.

The output buffer includes an inverter IN1 for inverting the output signal SAO from the sense amplifier; a NAND-gate ND for NANDing an output signal of the inverter IN1 and the output enable signal OES. An inverter IN2 inverts the output enable signal OES and a NOR gate NR NORs the output signal of the inverter IN1 and the inverted output enable signal OES from inverter IN2.

The output driver 20 is directly connected between a supply voltage Vcc and a ground voltage Vss. A PMOS transistor PM1 receives at its gate an output signal of the NAND gate ND, and an NMOS transistor NM1 receives at its gate an output signal of the NOR gate NR.

When an address signal ADD is transited as shown in FIG. 2A, the address transition detection signal ATD, as shown in FIG. 2B, is generated, and the output enable signal OES, as shown in FIG. 2C, is generated in accordance with the address transition detection signal ATD. In accordance with the address signal ADD, a data signal is outputted from a memory cell, and the sense amplifier amplifies and outputs the data signal to the output circuit.

When the sense amplifier senses a data signal, the output enable signal OES is rendered to a low level to thereby disable the output buffer 10, and when the sense amplifier completes its sensing operation, the output enable signal OES is turned to a high level to thereby enable the output buffer 10.

In other words, when a high level output enable signal OES is applied, and when the sense amplifier completes its operation, the nodes N1, N2 are respectively turned to a high level or low level in accordance with the output signal SAO from the sense amplifier. Accordingly, the PMOS transistor PM1 or the NMOS transistor NM1 is turned on or off to output a resultant data signal.

During a sensing operation of the sense amplifier, i.e., when a low level output enable signal OES is applied, the nodes N1, N2 are respectively turned to a high level and a low level. In accordance with the logic level of each of the nodes N1, N2, the PMOS transistor PM1 and the NMOS transistor NM1 is turned off. Therefore, the output signal of the output driver 20 slowly turns into a tri-stated signal, as shown in FIG. 2D, and the output signal being delayed by a load capacitance CL.

However, as shown in FIG. 2D, although the sense amplifier completes its sensing operation and the output enable signal OES is turned to a high level, an incompletely tri-stated data output signal OUT is outputted on an output node. The output speed is slower and the output signal has increased noise as well as causing an erroneous operation of the memory device.

SUMMARY OF THE INVENTION

An object of the present invention is to solve the problems of the related art.

Another object of the present invention is to increase a data output speed.

A further object of the present invention is to decrease an output noise.

Another object of the present invention is to provide a completed tri-state output signal.

The above features, objects and/or advantages of the present invention may be achieved in part or in whole by an output circuit, responsive to first and second signals, for a memory device, including an output buffer for buffering the first signal and the second signal; an output driver coupled to the output buffer at first and second nodes, the output driver having first, second, third and fourth transistors, the first and third transistors forming a first pair of parallel coupled transistors and the second and fourth transistors forming a second pair of parallel coupled transistors, wherein the first and second pairs are coupled to an output node.

The present invention may be also achieved in part or in whole by an output driver for an output circuit in a memory device, including first, second, third and fourth transistors, the first and third transistors forming a first pair of parallel coupled transistors, which is coupled to a first input node, and the second and fourth transistors forming a second pair of parallel coupled transistors, which is coupled to a second input node, wherein the first and second pairs are coupled to an output node.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein:

FIG. 1 is a circuit view of a conventional output circuit for a memory device;

FIGS. 2A through 2D are timing diagrams for respective signals in the circuit of FIG. 1;

FIGS. 4A through 4F are timing diagrams for respective signals in the circuit of FIG. 3.

DETAILED DESCRIPTION OF PREFERRED EMBODIMENTS

Figure 3:
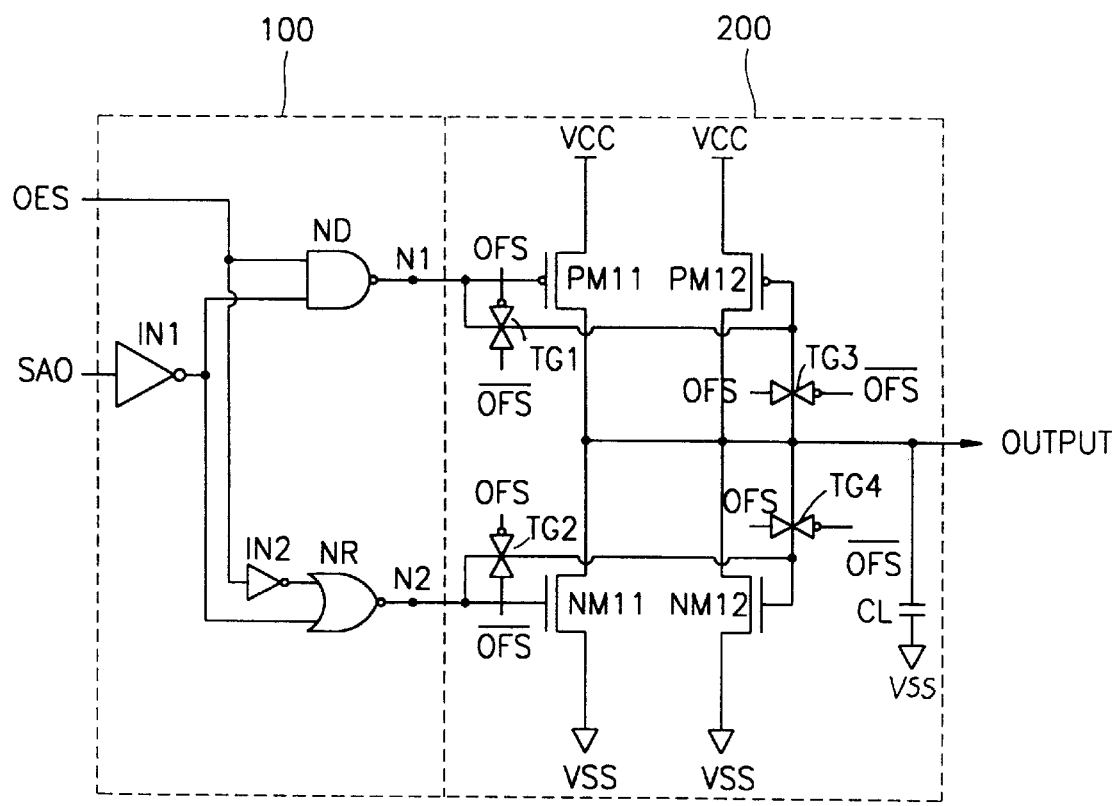
FIG. 3 is a circuit view of an output circuit for a memory device according to the present invention.

FIG. 3 illustrates an output circuit for a semiconductor memory device according to the present invention including an output buffer 100 and an output driver 200. The composition of the output buffer 100 is similar to that of the output buffer 10 according to the conventional art.

The output driver 200 is connected between a supply voltage Vcc and a ground voltage Vss and includes two pairs of parallel coupled transistors, wherein PMOS transistors PM11 and PM12 form a first pair and NMOS transistors NM11 and NM12 form a second pair, each coupled to an output node. An output signal of the NAND gate ND is applied to respective gates of the PMOS transistors PM11, PM12, and an output signal of the NOR gate NR is applied to respective gates of the NMOS transistors NM11, NM12. A first switch, e.g., a first transmission gate TG1, is connected between the NAND gate ND and the gate of the PMOS transistor PM12 and is controlled by an output feedback control signal OFS. A second switch, e.g., a second transmission gate TG2, is connected between the NOR gate NR and the gate of the NMOS transistor NM12 and is controlled by the output feedback control signal OFS. Third and fourth switches, e.g., third and fourth transmission gates TG3, TG4, are serially connected between respective gates of the PMOS transistor PM12 and the NMOS transistor NM12 and are further connected in common with an output terminal of the output driver 200, and controlled by the output feedback control signal OFS.

A channel W/L (width/length) size of the PMOS transistor PM11 is made twice that of the PMOS transistor PM12, and a channel W/L size of the NMOS transistor NM11 is approximately twice that of the NMOS transistor NM12. Further, the output feedback control signal OFS for the transmission gates TG1–TG4 is obtained by extending or elongating the width of the address transition detecting signal ATD in duration. Here, the output feedback control signal OFS is turned, when inverted, into another output feedback control signal/OFS.

When the address signal ADD is transited as shown in FIG. 4A the address transition detection signal ATD is generated as shown in FIG. 4B. On the basis of the address transition detection signal ATD, the output feedback control signal OFS, as shown in FIG. 4C, and the output enable signal OES, as shown in FIG. 4E, are generated. The output enable signal OES is turned to a low level during a data sensing operation of the sense amplifier to disable the output buffer 100. When the sense amplifier completes the data sensing operation, the output enable signal OES is turned to a high level.

Further, in the output circuit of the present invention, the output driver 200 is divided into the pair of PMOS transistors PM11, PM12 and the other pair of NMOS transistors NM11, NM12. One PMOS transistor and one NMOS transistor selected therefrom are controlled by the output feedback control signal OFS to accomplish a complete tri-state during a sensing operation of the sense amplifier.

Specifically, when a low level output enable signal OES is applied, i.e., when the sense amplifier carries out a sensing operation, the transmission gates TG3, TG4 are controlled using the high level output feedback control signal OFS generated by elongating the address transition detecting signal ATD in duration. As shown in FIG. 4F, when a high level output feedback control signal OFS is applied at time t1, the transmission gates TG1, TG2 are respectively turned off, and the transmission gates TG3, TG4 are turned on.

At this time, when the output signal OUT remains at a low level, the PMOS transistor PM12 is turned on, so that the output signal OUT transits quickly to a high level tri-stated signal. When the output signal OUT remains at a high level, the NMOS transistor NM12 is turned on, so that the output signal OUT transits quickly to a low level tri-stated signal. Since a channel W/L size of the PMOS transistor PM11 is made to be twice as large as that of the PMOS transistor PM12, and a channel W/L size of the NMOS transistor NM11 is also made to be approximately twice as large as that of the NMOS transistor NM12, the noise occurring when the transmission gates TG3, TG4 are turned on is decreased, and there is a decreased magnitude of current flowing from supply voltage Vcc to ground voltage Vss.

When a high level output feedback control signal OFS is applied, the transmission gates TG1 and TG2 are respectively turned off, so that the state of the respective nodes N1, N2 does not influence the PMOS transistor PM12 and the NMOS transistor NM12.

Next, when the output feedback control signal OFS is turned to a low level at time t2, the transmission gates TG1, TG2 are turned on, and the transmission gates TG3, TG4 are turned off. When the output feedback control signal OFS is applied at time point t3, that is to say, when the sense amplifier completes its sensing operation, the PMOS transistors PM11, PM12 and the NMOS transistors NM11, NM12 are respectively turned on or off depending on the state of the nodes N1, N2, thereby enabling a quicker data output.

In the output circuit for a memory device according to the present invention, the output driver is divided into two PMOS transistors and two NMOS transistors. A PMOS transistor and an NMOS transistor are respectively selected from among the pairs of PMOS, NMOS transistors by the output feedback control signal OFS for thereby turning the output signal of the output driver into a completely tri-stated signal, and when the sense amplifier completes its sensing operation, during a sensing operation. The respective pairs of PMOS, NMOS transistors are simultaneously controlled in accordance with the output signal of the output buffer.

As described above, the output circuit for a semiconductor memory device increases a data signal output speed and decreases an output noise, by turning the data output signal into a completely tri-stated signal during a sensing operation of the sense amplifier. In addition, the respective two PMOS, NMOS transistor pairs are simultaneously controlled when the sense amplifier completes its sensing operation, for thereby increasing the data output speed.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art.

What is claimed is:

1. An output circuit, responsive to first and second signals, for a memory device, comprising:

an output buffer for buffering the first signal and the second signal;

an output driver coupled to said output buffer at first and second nodes, said output driver having first, second, third and fourth transistors, said first and third transistors forming a first pair of parallel coupled transistors and said second and fourth transistors forming a second pair of parallel coupled transistors, wherein said first and second pairs are coupled to an output node;

a first switch coupled to the first node and said third transistor;

a second switch coupled to the second node and said fourth transistor; and a third switch directly connected to said third transistor and the output node.

2. The output circuit of claim 1, wherein said output buffer comprises:

first and second logic gates coupled for receiving the first signal;

a third logic gate coupled for receiving the second signal;

a fourth logic gate coupled for receiving outputs from said second and third logic gates.

3. The output circuit of claim 1, further comprising:

a fourth switch directly connected to said fourth transistor and the output node.

4. The output circuit of claim 3, wherein said first, second, third and fourth switches are first, second, third and fourth transmission gates, respectively.

5. The output circuit of claim 4, wherein said first, second, third and fourth transmission gates are responsive to a third signal and an inverted third signal.

6. The output circuit of claim 5, wherein the third and fourth signals are based on an address transition detection signal of the memory device which has been elongated in duration.

7. The output circuit of claim 1, wherein said first and second transistors are larger transistors than said third and fourth transistors.

8. The output circuit of claim 7, wherein said first and second transistors have a channel width and length ratio which is about twice than that of said third and fourth transistors.

9. The output circuit of claim 5, wherein each of said first, second, third and fourth transistors have a control electrode and first and second electrodes, the control electrodes of said first and second transistors are coupled to the first and second nodes, respectively, and the control electrodes of said third and fourth transistors are coupled to said first and second transmission gates, respectively.

10. The output circuit of claim 9, wherein said first electrodes of said first and third transistors are coupled for receiving a first prescribed voltage, said second electrodes of said first, second, third and fourth transistors are coupled to the output node, and said first electrodes of said second and fourth transistors are coupled for receiving a second prescribed voltage.

11. The output circuit of claim 5, wherein when the third signal transits to a first prescribed potential, the third and fourth transistors are driven based on a potential on the output node.

12. The output circuit of claim 11, wherein when the third signal transits to a second prescribed potential, the third and fourth transistors are driven based on potentials on the first and second nodes, respectively.

13. The output circuit of claim 12, wherein both the first and second pairs of transistors are simultaneous driven based on potentials on the first and second nodes, respectively, when an operation of the memory device is completed.

14. An output driver for an output circuit in a memory device, comprising first, second, third and fourth transistors, said first and third transistors forming a first pair of parallel coupled transistors, which is coupled to a first input node, and said second and fourth transistors forming a second pair of parallel coupled transistors, which is coupled to a second input node, wherein said first and second pairs are coupled to an output node;

a first transmission gate coupled to the first input node and said third transistor;

a second transmission gate coupled to the second input node and said fourth transistor;

a third transmission gate coupled to said third transistor and the output node; and a fourth transmission gate directly connected to said fourth transistor and the output node, wherein the first, second, third and fourth transmission gates are responsive to a first signal and an inverted first signal.

15. The output driver of claim 14, wherein said first and second transistors are larger transistors than said third and fourth transistors.

16. The output driver of claim 15, wherein said first and second transistors have a channel width and length ratio which is about twice than that of said third and fourth transistors.

17. The output driver of claim 14, wherein each of said first, second, third and fourth transistors have a control electrode and first and second electrodes, the control electrodes of said first and second transistors are coupled to the first and second input nodes, respectively, and the control electrodes of said third and fourth transistors are coupled to said first and second transmission gates, respectively.

18. The output driver of claim 17, wherein said first electrodes of said first and third transistors are coupled for receiving a first prescribed voltage, said second electrodes of said first, second, third and fourth transistors are coupled to the output node, and said first electrodes of said second and fourth transistors are coupled for receiving a second prescribed voltage.

19. The output circuit of claim 4, wherein the first and second transmission gates are enabled when the third and fourth transmission gates are disabled, and wherein the first and second transmission gates are disabled when the third and fourth transmission gates are enabled.

20. The output driver of claim 14, wherein the first and second transmission gates are enabled when the third and fourth transmission gates are disabled, and wherein the first and second transmission gates are disabled when the third and fourth transmission gates are enabled.

21. An output circuit, responsive to first and second signals, for a memory device, comprising:

an output buffer for buffering the first signal and the second signal;

an output driver coupled to said output buffer at first and second nodes, said output driver having first, second, third and fourth transistors, said first and third transistors forming a first pair of parallel coupled transistors and said second and fourth transistors forming a second pair of parallel coupled transistors, wherein said first and second pairs are coupled to an output node;

a first transmission gate coupled to the first node and said third transistor;

a second transmission gate coupled to the second node and said fourth transistor;

a third transmission gate directly connected to said third transistor and the output node; and a fourth transmission gate directly connect to said fourth transistor and the output node, wherein said first, second, third and fourth transmission gates are responsive to a third signal and an inverted third signal, wherein the third signal is an address transition detection signal of the memory device that has been elongated in duration.

22. The output circuit of claim 21, wherein when the third signal transits to a first prescribed potential, the third and fourth transistors are driven based on a potential on the output node, and wherein when the third signal transits to a second prescribed potential, the third and fourth transistors are driven based on potentials on the first and second nodes, respectively.

* * * * *